United States Patent
Kolpakov et al.

(10) Patent No.: US 6,855,237 B2
(45) Date of Patent: Feb. 15, 2005

(54) PULSED CARBON PLASMA APPARATUS

(75) Inventors: Alexandr Yakovlevich Kolpakov, Belgorod (RU); Vitaly Nikolaevich Inkin, Moscow (RU); Michael Grigorievich Kirpilenko, Moscow (RU)

(73) Assignee: International Technology Exchange, Inc., Tucson, AZ (US)

( * ) Notice: Subject to any disclaimer, the term of this patent is extended or adjusted under 35 U.S.C. 154(b) by 0 days.

(21) Appl. No.: 10/206,120

(22) Filed: Jul. 29, 2002

(65) Prior Publication Data

US 2004/0016641 A1 Jan. 29, 2004

Related U.S. Application Data

(63) Continuation of application No. PCT/RU01/00041, filed on Feb. 1, 2001.

(51) Int. Cl.[7] ............................................. C23C 14/34
(52) U.S. Cl. ............................. 204/298.41; 204/192.38
(58) Field of Search ........................ 204/192.38, 298.41

(56) References Cited

U.S. PATENT DOCUMENTS

| | | | | |
|---|---|---|---|---|
| 5,078,848 A | * | 1/1992 | Anttila et al. | 204/192.38 |
| 5,269,898 A | * | 12/1993 | Welty | 204/298.41 |
| 5,976,636 A | * | 11/1999 | Leu et al. | 204/192.38 |

* cited by examiner

*Primary Examiner*—Rodney G. McDonald

(57) ABSTRACT

The present invention provides a pulsed carbon plasma apparatus to produce a diamond-like carbon coating over an extended object, the coating having a high degree of thickness uniformity achieved by scanning the plasma flow over the surface of the object. The pulsed carbon plasma apparatus of the invention comprises a carbon plasma flow scanning device having at least one pair of deflecting coils, where the deflecting coils have, in the scanning plane, a different number of turns on opposite sides. The object may be made of metal, ceramic, glass or plastic. The coatings may be used to improve life and operating performance of tools and machine parts, and as decorative coatings.

9 Claims, 4 Drawing Sheets

PULSED CARBON PLASMA APPARATUS

RELATED APPLICATION

This application is a continuation of to PCT Patent Application No. PCT/RU01/00041, filed 1 Feb. 2001, the disclosure of which is incorporated by reference in its entirety for all purposes.

TECHNICAL FIELD

The present invention relates to an apparatus for applying coatings in vacuum and in particular to applying super-hard wear-resistant carbon coatings in vacuum and more specifically to a pulsed carbon plasma apparatus.

BACKGROUND

The invention is applicable for producing coatings in vacuum to an object, for example diamond-like carbon coatings, to extend life of cutting, shaping and measuring tools, friction units and parts of machines, as well as to improve biological compatibility of implants in medicine, and to extend life of video and audio read/write heads in electronics.

A vacuum coating apparatus for coating materials with a diamond-like coating using a pulsed plasma beam comprising electrodes coupled to a voltage source, a storage and a deflecting coil is known from U.S. Pat. No. 5,078,848. The apparatus described in U.S. Pat. No. 5,078,848, however, has an insufficiently reliable arc striking device and does not permit depositing coatings on extended objects. Furthermore, the coating produced is highly nonuniform in thickness.

The closest prior art is a pulsed carbon plasma apparatus comprising a consumable graphite cathode and an anode, both accommodated in a housing of a vacuum chamber and having a common geometrical axis, the consumable graphite cathode and the anode being electrically coupled to a capacitive storage shunted to a dc charger, and an arc striking device disposed in the vacuum chamber and connected to an initiation unit (see e.g. A. I. Maslov et al., *Journal of Experimental Instruments and Methods*, No. 3, 1985, pages 146–149). This apparatus has a restricted region of depositing a coating, and the coating produced is highly nonuniform. Focusing the plasma flow by the use of a focusing solenoid improves efficiency in the center, but still further increases the thickness nonuniformity of the coating. This method for controlling the energy characteristics suffers a number of deficiencies. With variation in the voltage of the capacitor, the charge of the capacitor is modified, resulting in variation in the cathode erosion region and, consequently, in the coating deposition area, leading to inhomogeneities. Furthermore, with a reduction in the capacitor voltage below a certain value, the reliability of initiating a discharge pulse is reduced. An increase in the capacitor voltage above a predetermined threshold leads to uncontrolled electrical breakdowns between electrodes, resulting in contamination of the carbon plasma and deterioration of the properties of the diamond-like condensate that is formed on the object.

SUMMARY OF THE INVENTION

The object of the present invention is to provide a pulsed ion plasma apparatus, in particular a pulsed carbon plasma apparatus, which makes it possible to deposit a coating over an extended object, and to improve the thickness uniformity of the coated layer by scanning the plasma flow over the surface of the object. The pulsed carbon plasma apparatus of the invention comprises a carbon plasma flow scanning device having at least one pair of deflecting coils, where the deflecting coils have, in the scanning plane, a different number of turns on opposite sides.

Another feature of the invention is the geometrical axes of the deflecting coils being aligned with the geometrical axis of the cathode and the anode.

Another feature of the invention is each of the deflecting coils comprising, in a scanning plane passing through the geometrical axis, a different number of turns on opposite sides so that a number of turns on one side of the deflecting coil is n, and a number of turns on the other side is (n+1), where n is an integer of 1, 2 or 3.

Another feature of the invention is the deflecting coils of each pair being turned relative to each other through 180° around the geometrical axes so that in the scanning plane the number of turns on one side of one of the coils is different from the number of turns on the same side of the other coil.

Another feature of the invention is the number of pairs of coils being selected in accordance with a shape of the object to be coated, and defining a number of scanning planes, the coils being arranged along the geometrical axis, but turned around the axis through a predetermined angle.

Another feature of the invention is the consumable graphite cathode having a shape selected from a cylinder, prism or a ring.

Another feature of the invention is the anode having a shape selected from a hollow cylinder or hollow prism, the side walls of the cylinder or prism being formed by rods, the longitudinal axis of which is parallel with the longitudinal axis of the cylinder or prism.

The present invention is suitable for producing ultra-hard carbon coatings with a high degree of thickness uniformity over an extended object. The object may be made of metal, ceramic, glass or plastic. The coatings may be used to improve life and operating performance of tools and machine parts, and as decorative coatings. The present invention may be modified to use other cathode materials, for example metals and oxides, to produce suitable coatings of such materials.

BRIEF DESCRIPTION OF THE DRAWINGS

The main features of the invention will become apparent upon examination of the accompanying drawings wherein.

DETAILED DESCRIPTION OF THE INVENTION

The pulsed carbon plasma apparatus of the invention comprises a carbon plasma flow scanning device having at least one pair of deflecting coils, which, in a scanning plane, have a different number of turns on opposite sides; a consumable graphite cathode and an anode, both accommodated in a vacuum chamber and having a common geometrical axis, the consumable graphite cathode and the anode being electrically coupled to a capacitive storage shunted to a dc charger; and an arc striking device disposed in the vacuum chamber and connected to an initiation unit. The deflecting coils are arranged in the vacuum chamber so that the geometrical axes of the deflecting coils are aligned with the geometrical axis of the cathode and the anode, and wound in one direction, one output of each coil in the pair of deflecting coils being connected to the anode, and another output being connected, via a controlled switch, to a positive output of the capacitive storage. Each of the deflecting coils comprise, in a scanning plane passing through the geometrical axis, a different number of turns on opposite sides so that a number of turns on one side of the deflecting coil is n, and a number of turns on the other side is (n+1), where n is an integer of 1, 2 or 3. The deflecting coils of each pair are turned relative to each other through 180° around the geometrical axes so that in the scanning plane the number of turns on one side of one of the coils is different from the number of turns on the same side of the other coil.

The outputs of the deflecting coils connected to the anode are preferably disposed in a plane perpendicular to the scanning plane and passing through the geometrical axis, on opposite sides of coils of one pair, and the outputs connected, via a controlled switch, to a positive output of the capacitive storage, are also disposed in a plane perpendicular to the scanning plane and passing through the geometrical axis, on opposite sides of coils of one pair.

The number of pairs of coils is advantageously selected in accordance with a shape of the object to be coated, and defines a number of scanning planes, the coils being arranged along the geometrical axis, but turned around the axis through a predetermined angle.

The apparatus preferably comprises a controlled inductance to provide electrical coupling between the consumable graphite cathode and a negative output of the capacitive storage.

The consumable graphite cathode preferably has a shape selected from a cylinder, prism or ring.

The anode preferably has a shape selected from a hollow cylinder, hollow prism, the side walls of the cylinder or prism being formed by rods, the longitudinal axis of which is parallel with the longitudinal axis of the cylinder or prism.

The controlled switch preferably comprises a control unit to determine an operation algorithm of the deflecting coils.

The arc striking device is preferably either a pulsed plasmatron or a pulsed laser.

Figure 1:
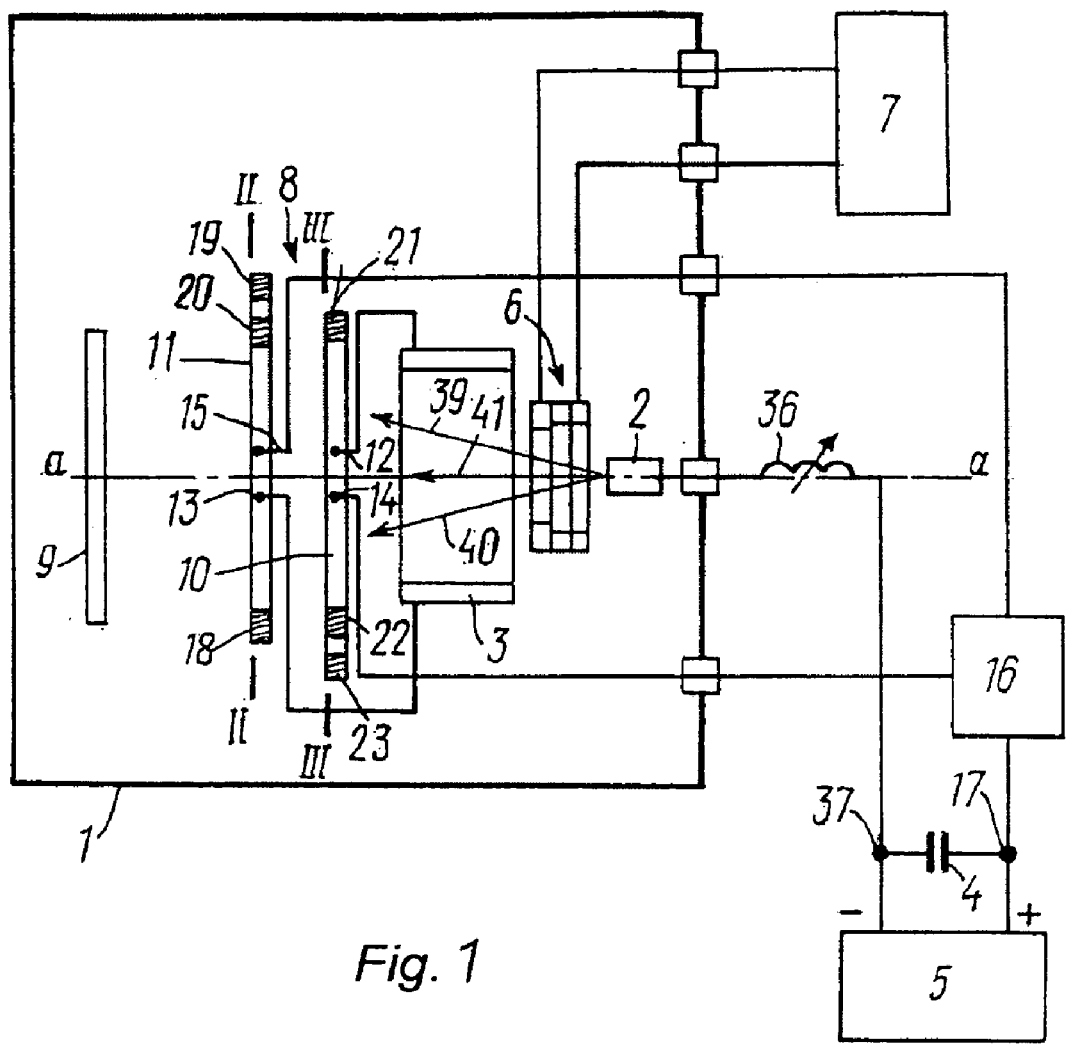
FIG. 1 shows a schematic diagram of a pulsed carbon plasma apparatus in accordance with the invention.

Referring to FIG. 1, the pulsed carbon plasma apparatus of the invention comprises a consumable graphite cathode 2 and an anode 3, both accommodated in a vacuum chamber 1 and having a common geometrical axis a—a, and electrically coupled to a capacitive storage 4 shunted to a dc charger 5. An arc striking device 6 is disposed in the vacuum chamber 1 and connected to an initiation unit 7.

The apparatus further comprises a device 8 for scanning carbon plasma flow over a surface of an object 9, the scanning device 8 having at least one pair of deflecting coils 10, 11 arranged in the vacuum chamber 1. The geometrical axes of the coils 10, 11 are aligned with the geometrical axis a—a of the cathode 2 and anode 3. The deflecting coils 10, 11 are wound in one direction. Output 12 of the deflecting coil 10 and output 13 of the coil 11 are connected to the anode 3. Output 14 of the deflecting coil 10 and output 15 of the deflecting coil 11 are connected, via a controlled switch 16, to a positive output 17 of the capacitive storage 4.

Figure 2:
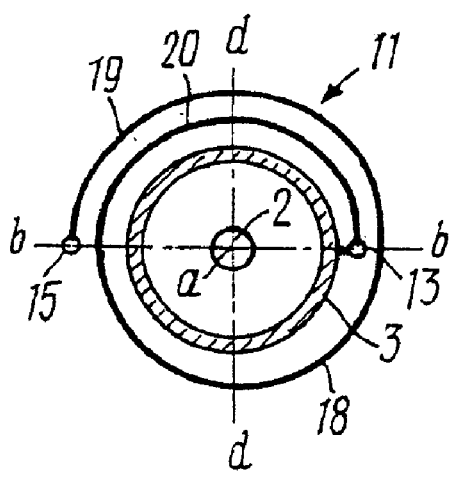
FIG. 2 shows a cross section taken at line II—II of FIG. 1.
Figure 3:
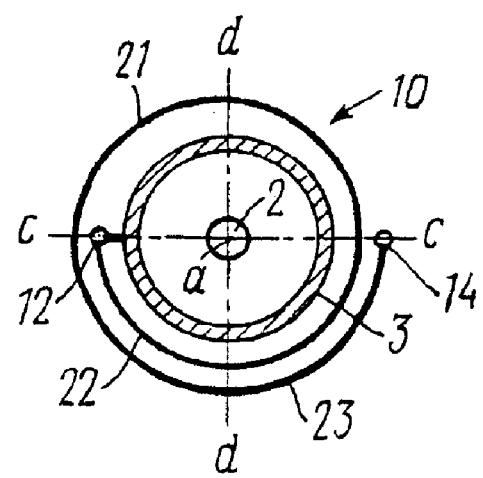
FIG. 3 shows a cross section taken at line III—III of FIG. 1.

FIGS. 2 and 3 schematically show turns of the deflecting coils 11 and 10, respectively, lying in planes perpendicular to the geometrical axis a—a and a scanning plane. Referring to FIG. 1, in the described embodiment, the scanning plane coincides with the plane of the drawing. In the scanning plane passing through the geometrical axis a—a, each of deflecting coils 10 and 11 has a different number of turns on opposite sides.

The number of turns 18 (FIG. 2) on one side of the deflecting coil 11 relative to line b—b is n, where n equals one in the described embodiment. The number of turns 19 and 20 on the other side of the deflecting coil is (n+1), where n is an integer of 1, 2 or 3, and equals two in the described embodiment. In possible embodiments, the smallest number of turns may be two and three, and the largest number of turns may be three and four.

The number of turns 21 (FIG. 3) on one side of the deflecting coil 10 relative to line c—c is n, where n equals one in the described embodiment. A number of turns 22 and 23 on the other side of the deflecting coil is (n+1), where n is an integer of 1, 2 or 3 and equals two in the described embodiment. In possible embodiments, the smallest number of turns may be two and three, and the greatest number of turns may be three and four.

Therefore, in the scanning plane (FIG. 1) passing through the geometrical axis a—a, each of the deflecting coils 10 and 11 has a different number of turns on opposite sides, i.e. the coil 10 has a turn 21 on one side, and turns 22 and 23 on the other side. The coil 11 has a turn 18 on one side, and turns 19 and 20 on the other side.

The deflecting coils 10 and 11 (FIGS. 2, 3) are turned relative to each other through 180° around the geometrical axis a—a so that in the scanning plane the number of turns on one side of one of the coils is different from the number of turns on the same side of the other coil. In FIGS. 2 and 3, the scanning plane passes through the axis d—d perpendicular to the plane of the drawing.

Outputs 12 and 13 (FIGS. 2 and 3) of the deflecting coils 10 and 11, respectively, connected to the anode 3 are disposed in a plane perpendicular to the scanning plane and passing through the geometrical axis, on opposite sides of the coils 10 and 11 of one pair, and outputs 14 and 15 connected, via a controlled switch 16, to a positive output 17 of the capacitive storage 4, are also disposed in a plane perpendicular to the scanning plane and passing through the geometrical axis, on opposite sides of the coils 10 and 11.

Figure 4:
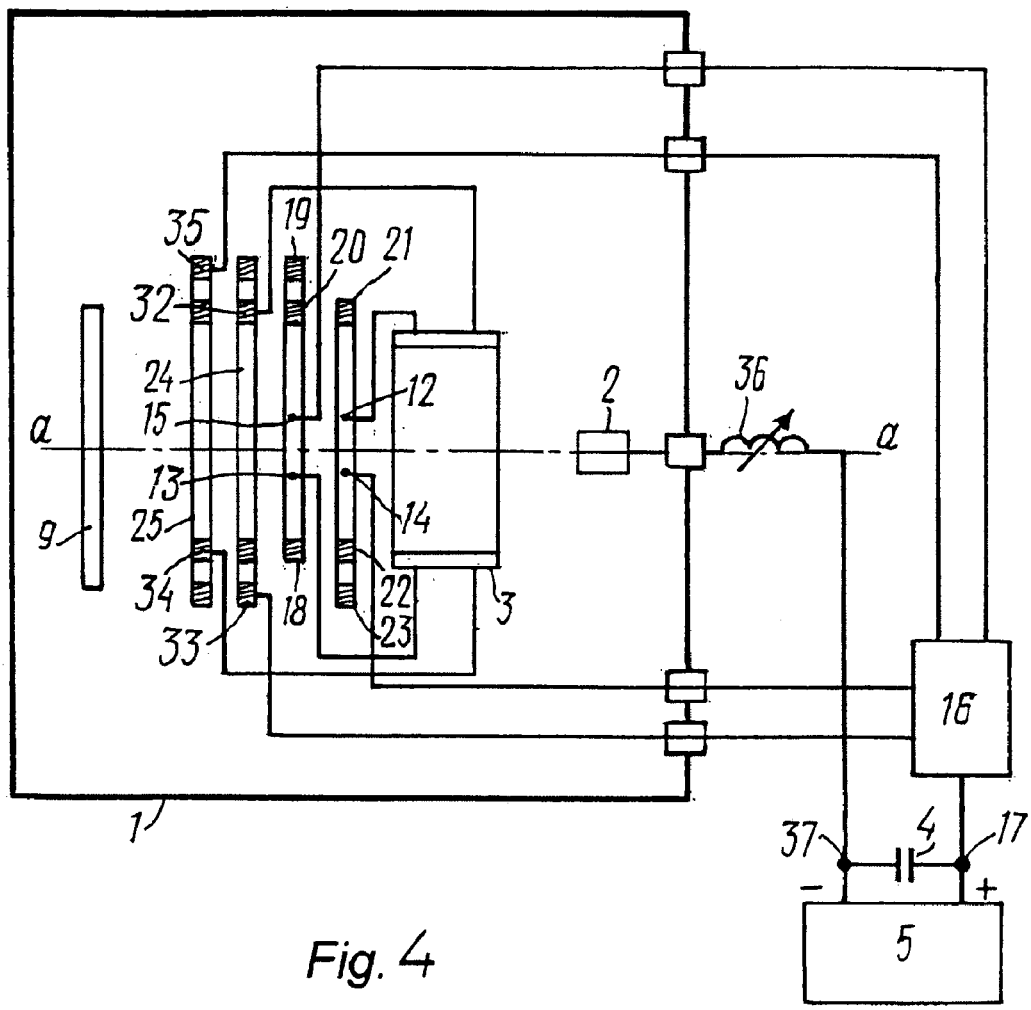
FIG. 4 shows a schematic diagram of a pulsed carbon plasma apparatus comprising two pairs of deflecting coils, in accordance with the invention.
Figure 5A:
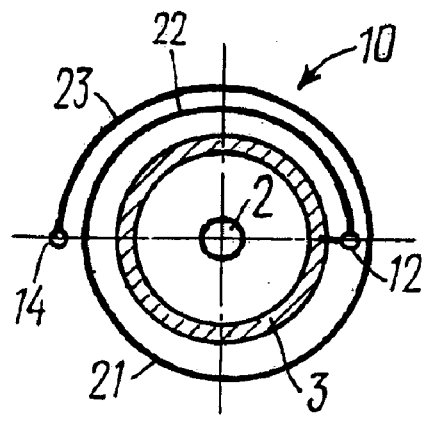
FIGS. 5(a, b, c, d) shows different arrangements of coils used to coat objects of different shapes, in accordance with the invention.
Figure 5B:
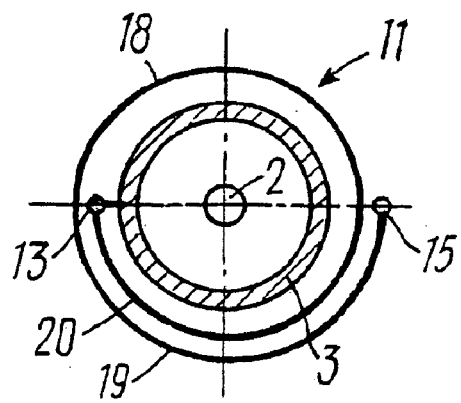
Figure 5C:
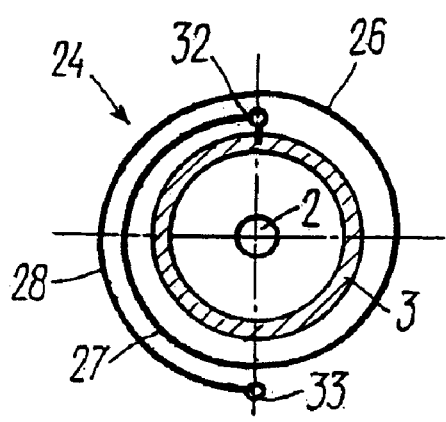
Figure 5D:
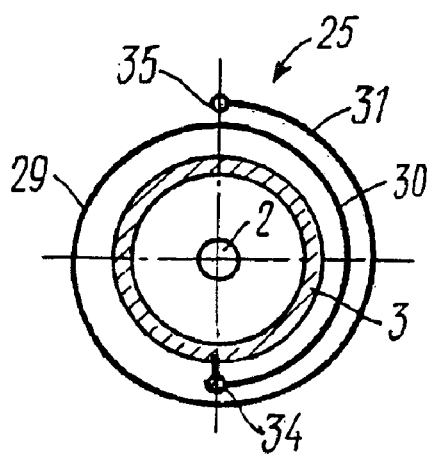

The number of pairs of coils is selected according to the shape of the object to be coated and defines the number of scanning planes. FIG. 4 shows an embodiment where the apparatus comprises two pairs of deflecting coils 10, 11, and 24, 25. The coils 10, 11, 24, 25 are arranged along the geometrical axis a—a and turned around the axis through a predetermined angle (not shown). FIGS. 5(a, b, c, d) shows an arrangement of windings in the pairs of coils and outputs of the coils. FIGS. 5c and 5d show an arrangement of windings 26, 27, 28 and 29, 30, 31 of the coils 24 and 25, respectively. Output 32 of the coil 24 and output 34 of the coil 25 are connected to the anode 3, and output 33 of the coil 24 and output 34 of the coil 25 are connected, via the controlled switch, to the positive output 17 of the capacitive storage 4.

The pulsed plasma apparatus further comprises a controlled inductance 36 (FIG. 1) to provide electrical coupling between the consumable graphite cathode 2 and the negative output 37 of the capacitive storage 4.

Figure 6A:
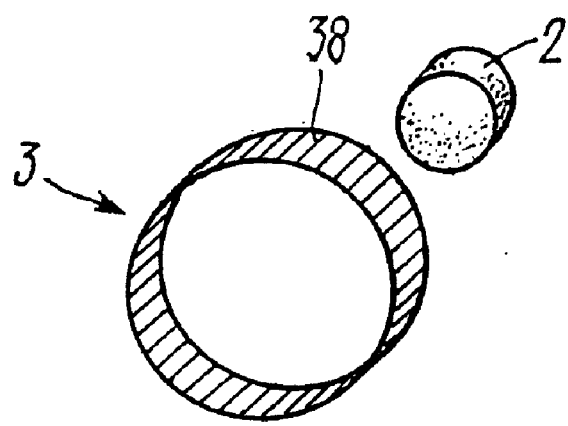
FIGS. 6(a, b, c) shows different embodiments of the anode and the cathode, in accordance with the invention.

The consumable graphite cathode 2 (FIGS. 6a, b, c) has a shape of a cylinder, or prism, or ring.

Figure 6B:
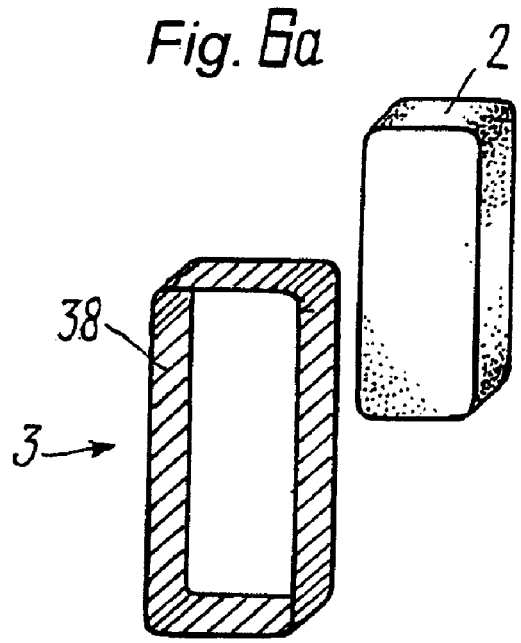
Figure 6C:
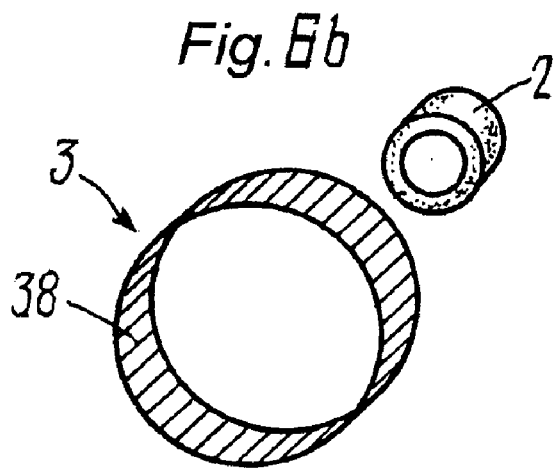

The anode 3 then has a shape of a hollow cylinder (FIG. 6a) or a hollow prism (FIG. 6b), respectively. The side walls of the cylinder or prism may be formed by rods 20 38, the longitudinal axis of which is parallel with the longitudinal axis of the cylinder or prism.

The controlled switch 16 comprises a control unit (not shown) to define an operation algorithm of the deflecting coils.

The arc striking device 6 may be a pulsed plasmatron (FIG. 1), or a pulsed laser (not shown).

The pulsed carbon plasma apparatus operates in the following manner. Upon evacuating the vacuum chamber 1 (FIG. 1), the capacitive storage 4 is charged from the dc charger 5. An operation algorithm of the deflecting coils 10 and 11 is defined by the control unit of the switch 16. To initiate a pulsed discharge, a voltage pulse is provided from the initiation unit 7 to the arc striking device 6, for example a pulsed plasmatron generating a plasma beam in the direction of the consumable graphite cathode 2.

When the striking plasma hits the surface of the consumable graphite cathode 2, a plurality of cathode spots appear on the surface, the cathode spots being the source of a highly-ionized carbon plasma. A pulsed vacuum arc discharge occurs between the cathode 2 and the anode 3 at the expense of the energy stored in the capacitive storage 4. The greatest portion of electrons (approximately 80–90% of the total discharge current) passes to the anode 3. The remaining electrons compensate for the charge of carbon ions moving toward the object 9, thereby generating a quasi-neutral carbon plasma beam. The capacitive storage 4 discharges across the following circuit: the consumable graphite cathode 2, the anode 3, the deflecting coils 10 or 11, simultaneously or separately, as specified by the control unit of the switch 16.

The magnetic field of the deflecting coils 10 and 11 magnetize the electron component of the carbon plasma so that the plasma ceases to be isotropic. Under such conditions, electrons may freely move only along lines of force of the magnetic field. An electrical potential appears within the plasma volume, which provides deflection of the ion component of the carbon plasma from the region of a stronger magnetic field generated by the asymmetric deflecting coils 10 and 11 to the region of a weaker magnetic field. There are three options of enabling the deflecting coils 10 and 11.

Option 1:

The switch 16 enables the deflecting coil 10. In this case, the plasma flow 39 is directed upwards relative to the axis a—a of symmetry and a carbon coating is deposited on the upper part of the surface of the object 9.

Option 2:

The switch 16 enables the deflecting coil 11. In this case, the plasma flow 40 is directed downwards with respect to the axis a—a of symmetry and a carbon coating is deposited on the lower part of the surface of the object 9.

Option 3:

The switch 16 enables both deflecting coils 10 and 11. The plasma flow 41 is directed along the axis a—a of symmetry and a carbon coating is predominantly deposited on the surface of the object 9, which intersects the axis of symmetry of the carbon pulsed plasma apparatus.

By specifying an operation algorithm of the deflecting coils 10 and 11 through the control unit of the switch 16, the region of depositing a diamond-like carbon coating on the object 9 may be extended, and the thickness uniformity of the coating produced is improved.

By specifying a number n of turns in the deflecting coils within the range of n=1, 2 or 3, the angle of deflection of the plasma carbon flow 39, 40 and 41 from the axis a—a of symmetry of the pulse carbon plasma apparatus is modified. The greatest deflection angle corresponds to n=1, as in this case the magnitude of the magnetic field generated by one turn is approximately half as large as that of the magnetic field generated by two turns.

With the number of turns above 3, the plasma carbon flow is refocused. This manifests itself as a dramatic reduction in the plasma flow diameter, resulting in increased nonuniformity of the coating thickness. Further, a "magnetic plug" effect occurs which closes the carbon plasma within the space between the consumable graphite cathode 2 and the anode 3, thereby reducing efficiency of the pulsed carbon plasma apparatus.

The energy characteristics of the carbon plasma govern the properties of the diamond-like carbon coating produced on the object. With deficiency in energy, formation of the carbon condensate with predominantly diamond-type coupling is unfeasible. With excess energy, irradiation defects accumulate in the formed carbon coating and impair properties of the diamond-like condensate. Taking into account that carbon exhibits a great number of allotropic modifications, the possibility of modifying energy characteristics of the carbon flow within a wide range opens opportunities to produce carbon coatings with predetermined characteristics.

By varying the inductance value by changing the number of turns, the discharge pulse duration, carbon plasma energy characteristics, the erosion factor of the consumable graphite cathode and the angle of deflection of the carbon plasma flow may be controlled.

What is claimed is:

1. A pulsed carbon plasma apparatus for depositing a diamond-like carbon coating on an object, comprising:

(a) a consumable graphite cathode and an anode, both accommodated in a vacuum chamber and having a common geometrical axis, the consumable graphite cathode and the anode being electrically coupled to a capacitive storage shunted to a dc charger, (b) an arc striking device disposed in the vacuum chamber and connected to an initiation unit, (c) a device for scanning a carbon plasma flow over a surface of the object, the scanning device having at least one pair of deflecting coils arranged in the vacuum chamber so that the geometrical axes of the deflecting coils are aligned with the geometrical axis of the cathode and the anode, and wound in one direction, one output of each coil in the pair of deflecting coils being connected to the anode, and another output being connected, via a controlled switch, to a positive output of the capacitive storage, each of the deflecting coils having, in a scanning plane passing through the geometrical axis, a different number of turns on opposite sides so that a number of turns on one side of the deflecting coil is n, and a number of turns on the other side is (n+1), where n is an integer of 1, 2 or 3, the deflecting coils in said at least one pair being turned relative to each other through 180° around the geometrical axes so that in the scanning plane the number of turns on one side of one of the coils is different from the number of turns on the same side of the other coil.

2. The pulsed carbon plasma apparatus according to claim 1, characterized in that said outputs of the deflecting coils connected to the anode are disposed in a plane perpendicular to the scanning plane and passing through the geometrical axis, on opposite sides of the coils of one pair, and said outputs connected, via a controlled switch, to a positive output of the capacitive storage, are also disposed in a plane perpendicular to the scanning plane and passing through the geometrical axis, on opposite sides of the coils of said at least one pair.

3. The pulsed carbon plasma apparatus according to claim 1, characterized in that the number of pairs of coils comprises a number of pairs of coils selected in accordance with the shape of the object to be coated and defines a number of scanning planes, the coils being arranged along the geometrical axis, but turned around the axis through a predetermined angle.

4. The pulsed carbon plasma apparatus according to claim 1, characterized by comprising a controlled inductance to provide electrical coupling between the consumable graphite cathode and a negative output of the capacitive storage.

5. The pulsed carbon plasma apparatus according to claim 1, characterized in that said consumable graphite cathode has a shape selected from a cylinder, prism or ring.

6. The pulsed carbon plasma apparatus according to claim 1, characterized in that said anode has a shape selected from a hollow cylinder or hollow prism, with side walls of the cylinder or prism formed by rods having the longitudinal axis parallel with the longitudinal axis of the cylinder or prism.

7. The pulsed carbon plasma apparatus according to claim 1, characterized in that said controlled switch comprises a control unit to determine an operation algorithm of the deflecting coils.

8. The pulsed carbon plasma apparatus according to claim 1, characterized in that said arc striking device is a pulsed plasmatron.

9. The pulsed carbon plasma apparatus according to claim 1, characterized in that said arc striking device is a pulsed laser.

* * * * *